(12) United States Patent
Raorane

(10) Patent No.: US 11,742,270 B2
(45) Date of Patent: Aug. 29, 2023

(54) LANDING PAD APPARATUS FOR THROUGH-SILICON-VIAS

(71) Applicant: Intel Corporation, Santa Clara, CA (US)

(72) Inventor: Digvijay A. Raorane, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 715 days.

(21) Appl. No.: 16/349,583

(22) PCT Filed: Dec. 15, 2016

(86) PCT No.: PCT/US2016/067037
§ 371 (c)(1),
(2) Date: May 13, 2019

(87) PCT Pub. No.: WO2018/111286
PCT Pub. Date: Jun. 21, 2018

(65) Prior Publication Data
US 2021/0287975 A1 Sep. 16, 2021

(51) Int. Cl.
*H01L 23/498* (2006.01)
*H01L 23/00* (2006.01)
(52) U.S. Cl.
CPC .. *H01L 23/49822* (2013.01); *H01L 23/49872* (2013.01); *H01L 24/13* (2013.01); *H01L 2224/13124* (2013.01); *H01L 2224/13147* (2013.01); *H01L 2224/13155* (2013.01)

(58) Field of Classification Search
CPC ......... H01L 23/49822; H01L 23/49827; H01L 23/49811; H01L 23/49838
See application file for complete search history.

(56) References Cited

U.S. PATENT DOCUMENTS

| | | | |
|---|---|---|---|
| 6,108,212 A | 8/2000 | Lach et al. | |
| 8,269,350 B1 * | 9/2012 | Chen | H01L 23/49827 257/774 |
| 9,922,920 B1 * | 3/2018 | Lin | H01L 21/78 |
| 2003/0067730 A1 * | 4/2003 | Anthony | H01L 23/552 361/118 |
| 2003/0136579 A1 | 7/2003 | Searls et al. | |
| 2008/0105987 A1 * | 5/2008 | Hosomi | H01L 23/49827 257/784 |

(Continued)

FOREIGN PATENT DOCUMENTS

WO WO-2010023812 A1 * 3/2010 ........... H01L 23/481

OTHER PUBLICATIONS

International Search Report and Written Opinion for International Patent Application No. PCT/US16/67037, dated Aug. 30, 2017.

(Continued)

*Primary Examiner* — Michele Fan
(74) *Attorney, Agent, or Firm* — Essential Patents Group, LLP

(57) ABSTRACT

An apparatus is provided which comprises: a plurality of interconnects to couple a silicon interposer to a substrate; and a landing pad configured in a non-circle shape, wherein the plurality of interconnects are adjacent to the landing pad at one end of the plurality of interconnects through a plurality of vias.

20 Claims, 12 Drawing Sheets

(56) References Cited

U.S. PATENT DOCUMENTS

| | | | |
|---|---|---|---|
| 2011/0115082 A1* | 5/2011 | Gluschenkov | H05K 1/0286 |
| | | | 257/E21.585 |
| 2011/0156226 A1 | 6/2011 | Kasuya et al. | |
| 2014/0346678 A1* | 11/2014 | DeLaCruz | H01L 23/5386 |
| | | | 257/774 |
| 2015/0102482 A1* | 4/2015 | Liu | H01L 23/147 |
| | | | 257/737 |
| 2015/0111318 A1 | 4/2015 | Lyne et al. | |
| 2016/0013144 A1* | 1/2016 | Chen | H01L 23/3128 |
| | | | 257/774 |
| 2017/0135203 A1* | 5/2017 | Shen | H01L 23/562 |

OTHER PUBLICATIONS

International Preliminary Report on Patentability from PCT/US16/67037 dated Jun. 27, 2019, 11 pgs.

* cited by examiner

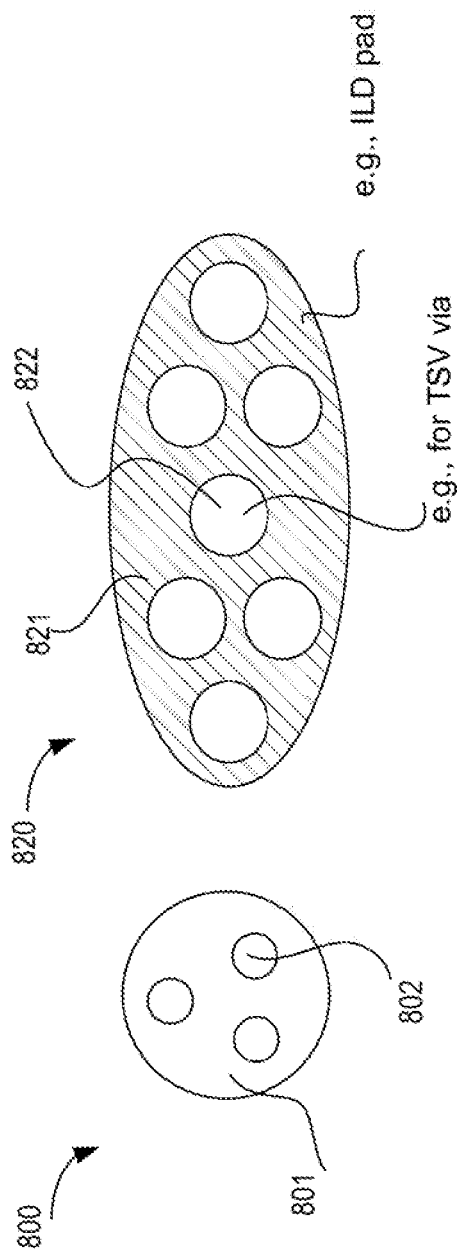

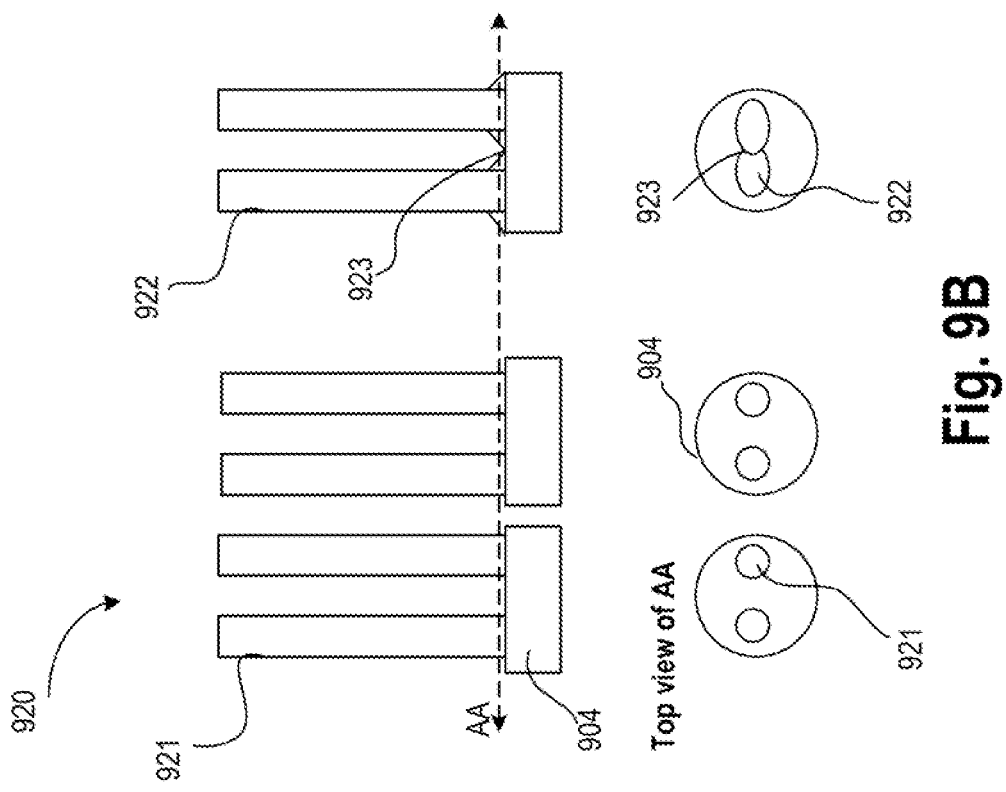
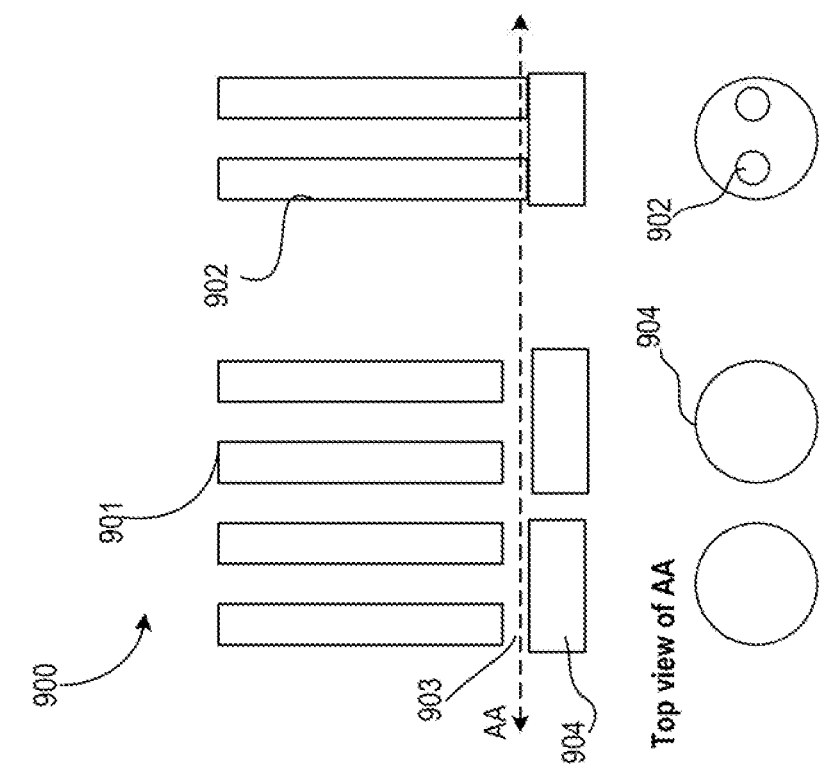
Fig. 9A
Fig. 9B

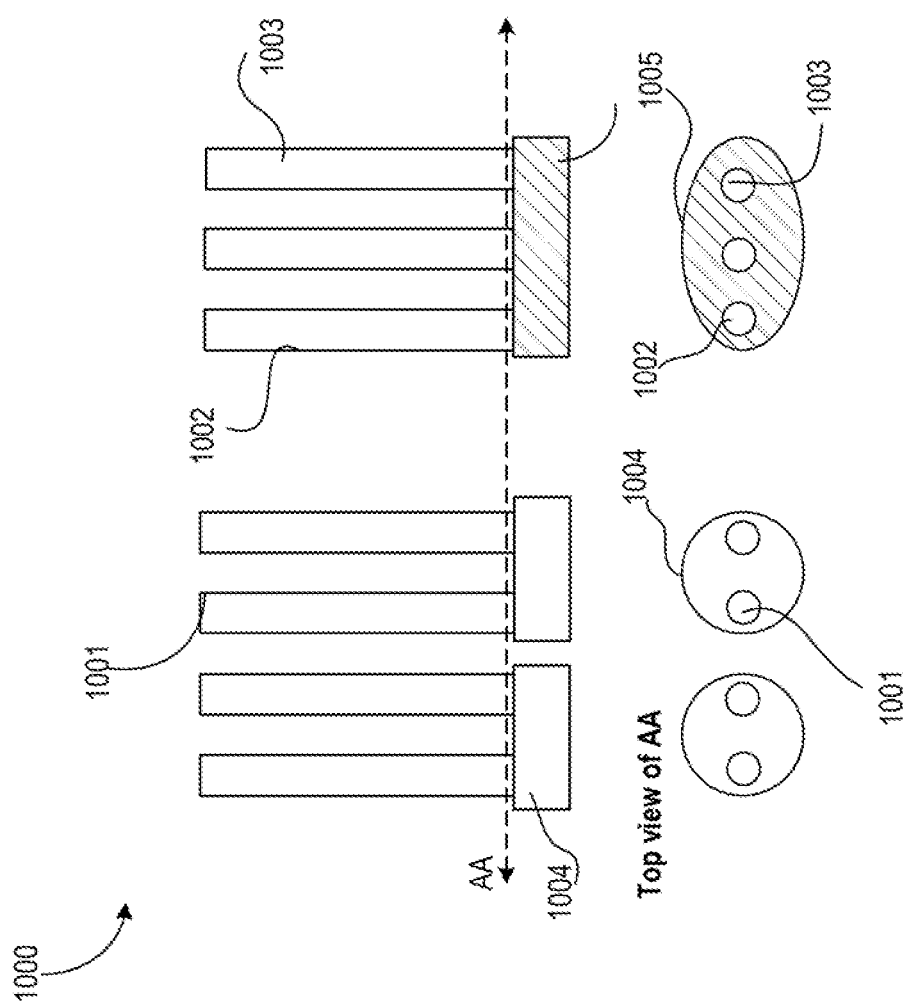

LANDING PAD APPARATUS FOR THROUGH-SILICON-VIAS

CLAIM OF PRIORITY

This Application is a National Stage Entry of, and claims priority to, PCT Application No. PCT/US16/67037, filed on 15 Dec. 2016 and titled "LANDING PAD APPARATUS FOR THROUGH-SILICON-VIAS," which is incorporated by reference in its entirety for all purposes.

BACKGROUND

Through-silicon-vias (TSVs) are used for integrating various dies in an integrated circuit (IC). These TSVs pass through multiple layers including active layers having transistors. The TSVs land on landing pads, which are eventually coupled to solder or substrate bumps. In some embodiments, some TSVs electrically couple their respective solder bumps while other TSVs have a gap between their edge and their associated landing pads. This gap results in an open circuit which may be caused due to etching inaccuracies. In some cases, some TSVs are undercut due to over-etching and thus may short with each other when coupling with associated landing pads. In some cases, when substrate bump pitch shrinks and gaps between the substrate bumps in an IC reduces, IC yield suffers due to non-uniformity in bump heights leading to epoxy voids (e.g., epoxy flow voids due to abrupt transitions). Current shapes of TSV landing pads result in routing issues. For example, the space between neighboring TSV landing pads is narrow and barely allows for one interconnect routing. Existing shapes of TSV landing pads result in large voids in transition zones which increase the probability of epoxy voids. Further, existing shape of TSV landing pads may be the limiter for power delivery targets because very limited space is provided to route power interconnects.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 8A illustrates a top view of a circle landing pad with three TSVs for power and/or ground supply routing.

FIG. 8B illustrates a top view of a non-circle landing pad with more than three TSVs for power and/or ground supply routing, according to some embodiments of the disclosure.

FIG. 9A illustrates a cross-section of a substrate with some TSVs having a gap between landing pads causing electrical open circuits.

FIG. 9B illustrates a cross-section of a substrate with some undercut TSVs resulting in electrical shorts in the landing pads.

FIG. 10 illustrates a cross-section of a substrate with non-circle landing pad(s) and dummy TSVs for mitigating the issues of opens and shorts illustrated in FIGS. 9A-B, according to some embodiments of the disclosure.

DETAILED DESCRIPTION

Figure 1:
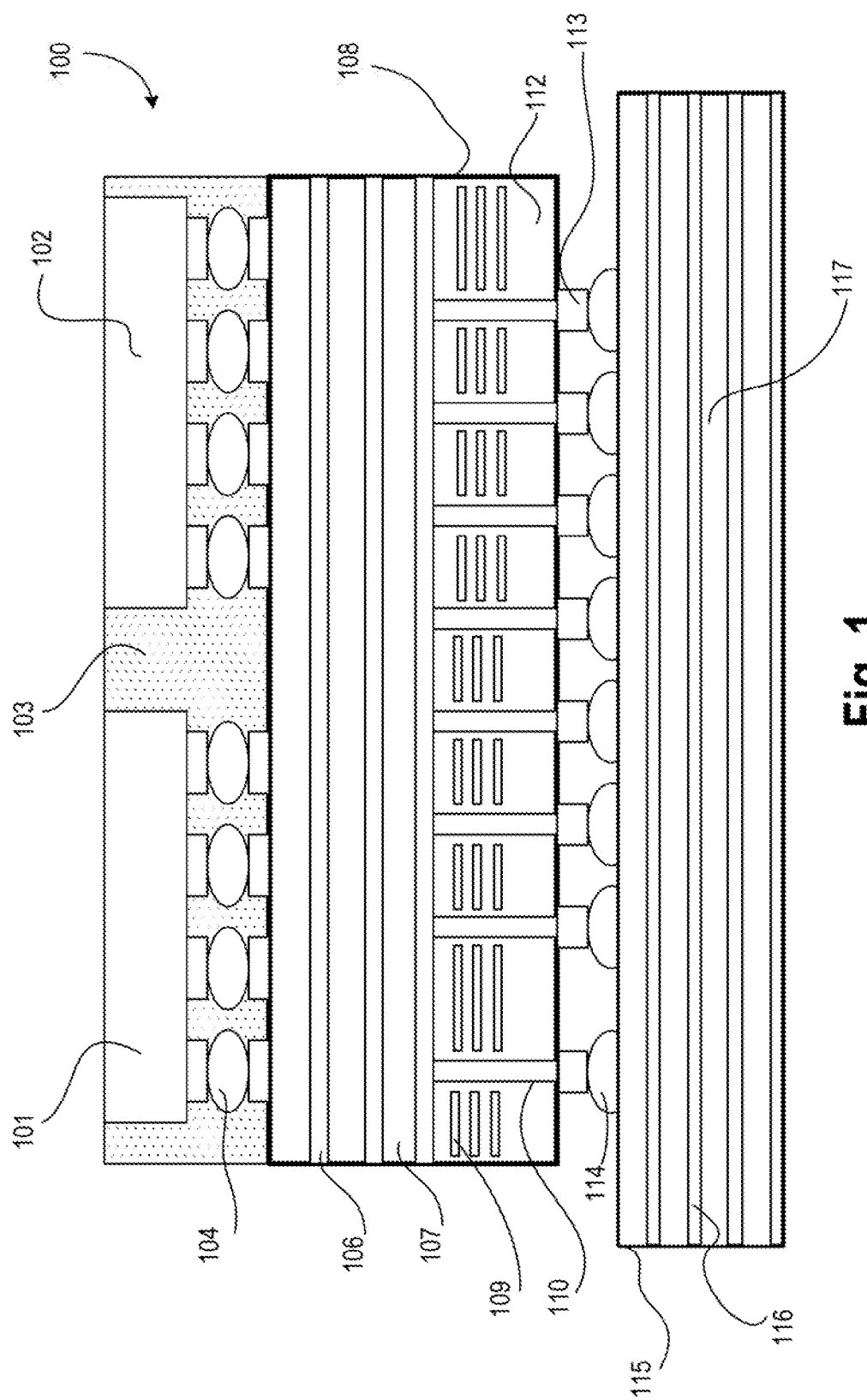
FIG. 1 illustrates a cross-section of a three dimensional (3D) integrated circuit (IC) stack with interposer-to-substrate interconnects (ILIs) that may suffer from undercuts and/or opens.

Various embodiments describe a through-silicon-via (TSV) layout to achieve uniformity in TSV etch. In some embodiments, placement and number of TSVs are changed from traditional placement and number such that abnormalities in the etching process are mitigated. For example, dummy or extra TSVs are placed next to functional TSVs (e.g., those carrying signals, power, or ground) to increase the density of TSVs thereby achieving uniformity in TSV etch. The TSVs land on landing pads or bumps. In some embodiments, the shape of the landing pads is changed to non-circle shape (e.g., oval, rectangle, L-shaped, S-shaped, U-shaped, elliptical shaped, a shape achieved by merging of two circles, etc.) to couple with a plurality of TSVs.

There are many technical effects of the various embodiments. For example, the layout (e.g., shape and/or placement) of the TSV landing pads, and the increased number of TSVs avoids the TSV undercut by eliminating the need for significant over-etch. The non-circle shape of the landing pads provides the flexibility in routing by increasing the space between landing pads. The increased space (while maintaining the center location of the landing pads) increases input-output (I/O) density (e.g., provides more opportunity of escape routing in an I/O region). In some embodiments, the non-circle landing pads for the TSVs are positioned at the transition regions (e.g., regions between two different types of landing pad patterns) resulting in reduced transition region areas. As such, the probability of voids in epoxies between joints is reduced.

The non-circle shape of the TSV landing pads improve non-uniformity in ILI (interposer-to-substrate interconnect) or substrate bump heights by controlling the density of the material (e.g., Cu) forming the ILI or substrate bumps in a given region. For example, when solder is plated on substrate, co-planarity of solder depends on the pattern of substrate bumps. Here, ILIs are also referred to as TSVs. The non-circle shape of the TSV landing pads can also increase bump-to-bump (e.g., horizontal distance between substrate bumps) to enable capillary underfill (CUF). The non-circle shape of the TSV landing pads allows for smooth transitions in ILI/TSV patterns. For example, by changing the TSV landing pad shape in the transition regions, voids in epoxy flow can be avoided. The non-circle shape of the TSV landing pads also allows for optimizing metal density to improve chip-yield-attach. Chip-yield-attach is the yield in attaching an integrated circuit (IC) to a substrate, for example. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front", "back," "top," "bottom," "over," "under," and the like in the description and in the claims, if any, are used for descriptive purposes and not necessarily for describing permanent relative positions.

FIG. 1 illustrates cross-section 100 of a three dimensional (3D) integrated circuit (IC) stack with interposer-to-substrate interconnects (ILIs) that may suffer from undercuts and/or opens. The 3D IC stack includes a first die 101, a second die 102, an epoxy or mold region 103, solder bumps 104, interposer section 108, and substrate section 115. Here, the solder bumps 104 are used for attaching the first and second dies (101 and 102, respectively) with interposer section 108. Interposer section 108 includes horizontal interconnects 106 and 109 separated from each other by an insulating material 107/112.

Interposer section 108 also includes interposer-to-substrate interconnects (ILIs) 110 (also known as through-silicon-vias (TSVs)) that couple substrate section 114 to first/second dies 101/102. Some of these horizontal interconnects are coupled through vias (or vertical interconnects) to solder bumps 104 and TSVs 110. The TSVs 110 are coupled to the substrate region 115 through TSV landing pads 113 and substrate bumps 114. These landing pads are circle landing pads (i.e., the landing pads have a circle shape). The substrate region 115 can be a printed circuit board (PCB) with interconnects 116 separated by insulating material 117. As discussed in the background section, undercuts to the TSVs 110 may cause open gaps between TSVs 110 and landing pads 113. In some cases, abnormalities in the etching process may cause TSVs 110 to short with other TSVs sharing a landing pad.

In some embodiments, the first and second dies (101 and 102, respectively) can be any integrated circuit. For example, first die 101 is a modem or baseband processor while the second die 102 is an RF (radio frequency) IC. In another example, first or second dies (101 or 102) are system-on-chips (SOCs) as described with reference to FIG. 12.

Figure 2:
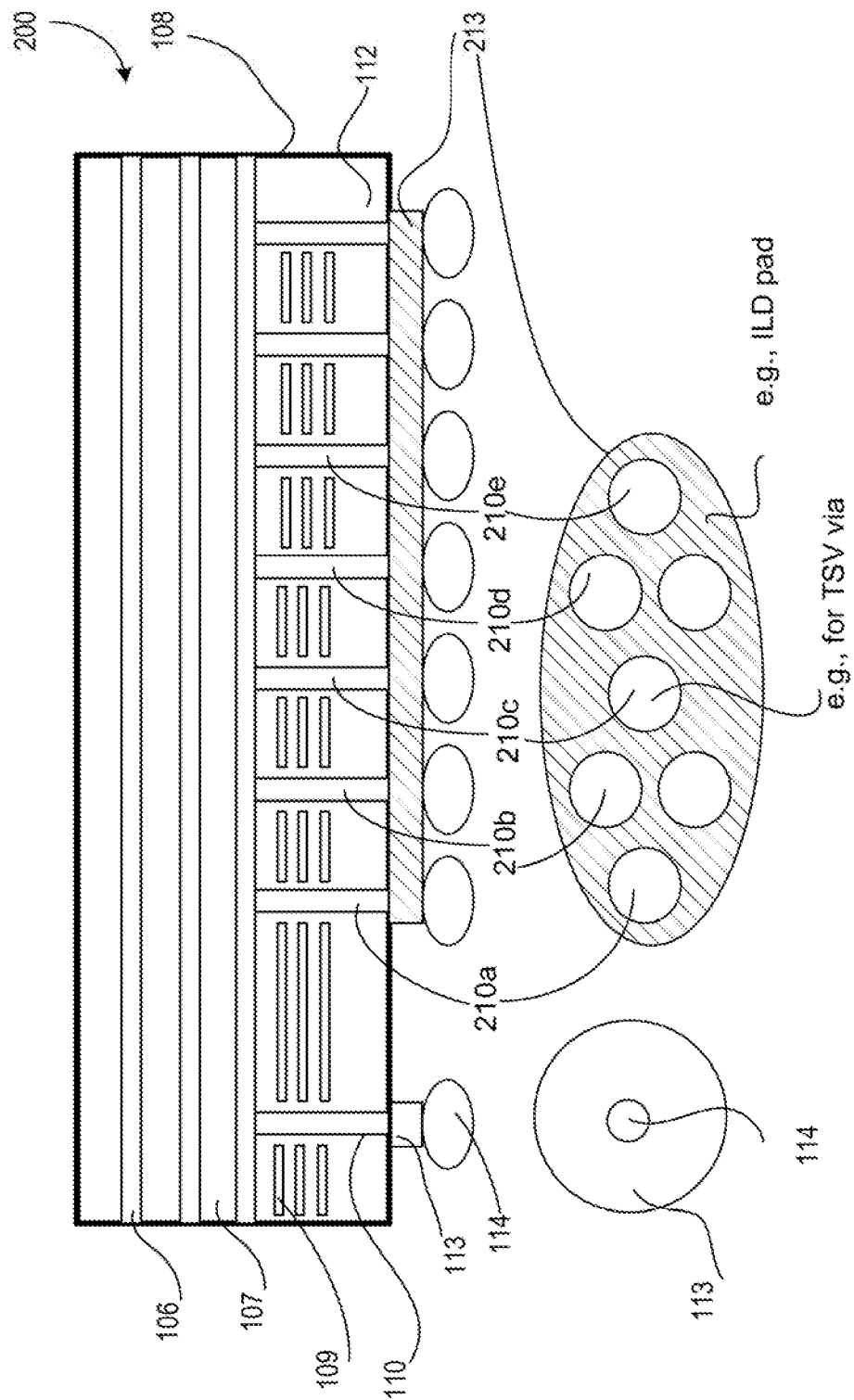
FIG. 2 illustrates a cross-section of part of a 3D IC stack with non-circle landing pads, according to some embodiments of the disclosure.

FIG. 2 illustrates cross-section 200 of part of a 3D IC stack with non-circle landing pads, according to some embodiments of the disclosure. It is pointed out that those elements of FIG. 2 having the same reference numbers (or names) as the elements of any other figure can operate or function in any manner similar to that described, but are not limited to such. Compared to the circle shape of the TSV landing pads 113 which lands one TSV 110, one or more non-circle shaped landing pads 213 are provided which couple several TSVs (e.g., TSVs 210a, 210b, 210c, 210d, and 210e), according to some embodiments. The number of TSVs shown here that land on non-circle landing pad 213 is shown as an example. Any number of TSVs (depending on the limits of process technology) may be landed on a non-circle landing pad. A person skilled in the art would appreciate that TSVs couple to TSV vias which land on the landing pads. However, for the sake of simplicity in describing the various embodiments, TSVs are shown landing on the landing pads and the TSV vias, which are present, are not shown. While the non-circle landing pad 213 is illustrated as an oval landing pad, other shapes can be used. For example, rectangle, L-shaped, S-shaped, U-shaped, elliptical shaped, a shape achieved by merging of two circles, etc. may be used instead of oval shape for the landing pad to couple with a plurality of TSVs. The non-circle landing pad 213 can be formed of a variety of materials. For example, non-circle landing pad 213 can be formed of a material selected from a group consisting of Cu, Al, and Ni. In some embodiments, Au or Ni plating is coated over the TSV landing pads 213.

Depending on the etch rate (e.g., rate of etching the TSVs before they are coupled or attached to their respective landing pads), the layout of TSVs can be changed to allow for uniform etch rate for the TSVs. Uniform etch rate mitigates the problems of opens and shorts in the TSVs. In some embodiments, when the etch rate is faster than expected (such that the etch rate may cause opens and shorts in the TSVs), more TSVs can be added (e.g., by adding extra or dummy TSVs) and more TSVs can be connected or coupled to the same TSV landing pad. As such the density of TSVs per landing pad is increased. In this example, by coupling several TSVs (e.g., TSVs 210a, 210b, 210c, 210d, and 210e) to the same landing pad 213, the problems associated with fast etch rate are mitigated. The feasibility of varying the size and shape of the TSV landing pad provides a designer the freedom to achieve uniform etch rate, in accordance with some embodiments.

Several unexpected results are observed by using non-circle TSV landing pads. For example, the non-circle shaped TSV landing pad 213 and the increased number of TSVs (e.g., TSVs 210a, 210b, 210c, 210d, and 210e) avoids the TSV undercut by eliminating the need for significant over-etch. The non-circle shape of TSV landing pad 213 provides the flexibility in routing by increasing the space between landing pads (e.g., as discussed with reference to FIGS. 3-4). Referring back to FIG. 2, the increased space (while maintaining the center location of the landing pads) increases input-output (I/O) density (e.g., provides more opportunity of escape routing in an I/O region). In some embodiments, non-circle landing pad 213 for the TSVs are positioned at the transition regions (e.g., regions between two different types of landing pad patterns) resulting in reduced transition region areas. As such, the probability of voids in epoxies between joints is reduced as discussed with reference to FIGS. 7A-B.

Referring back to FIG. 2, the non-circle shape of the TSV landing pad 213 improves non-uniformity in ILI (interposer-to-substrate interconnect) or substrate bump heights by controlling the density of the material (e.g., Cu) forming the ILI or substrate bumps in a given region. The non-circle shape of the TSV landing pad 213 can also increase bump-to-bump (e.g., horizontal distance between substrate bumps 114) to enable capillary underfill (CUF). The non-circle shape of the TSV landing pad 213 allows for smooth transitions in the ILI/TSV patterns. For example, by changing the TSV landing pad shape in the transition regions, voids in epoxy flow can be avoided as discussed with reference to FIGS. 7A-B. The non-circle shape of the TSV landing pad 213 also allows for optimizing metal density to improve chip-yield-attach.

Figure 3:
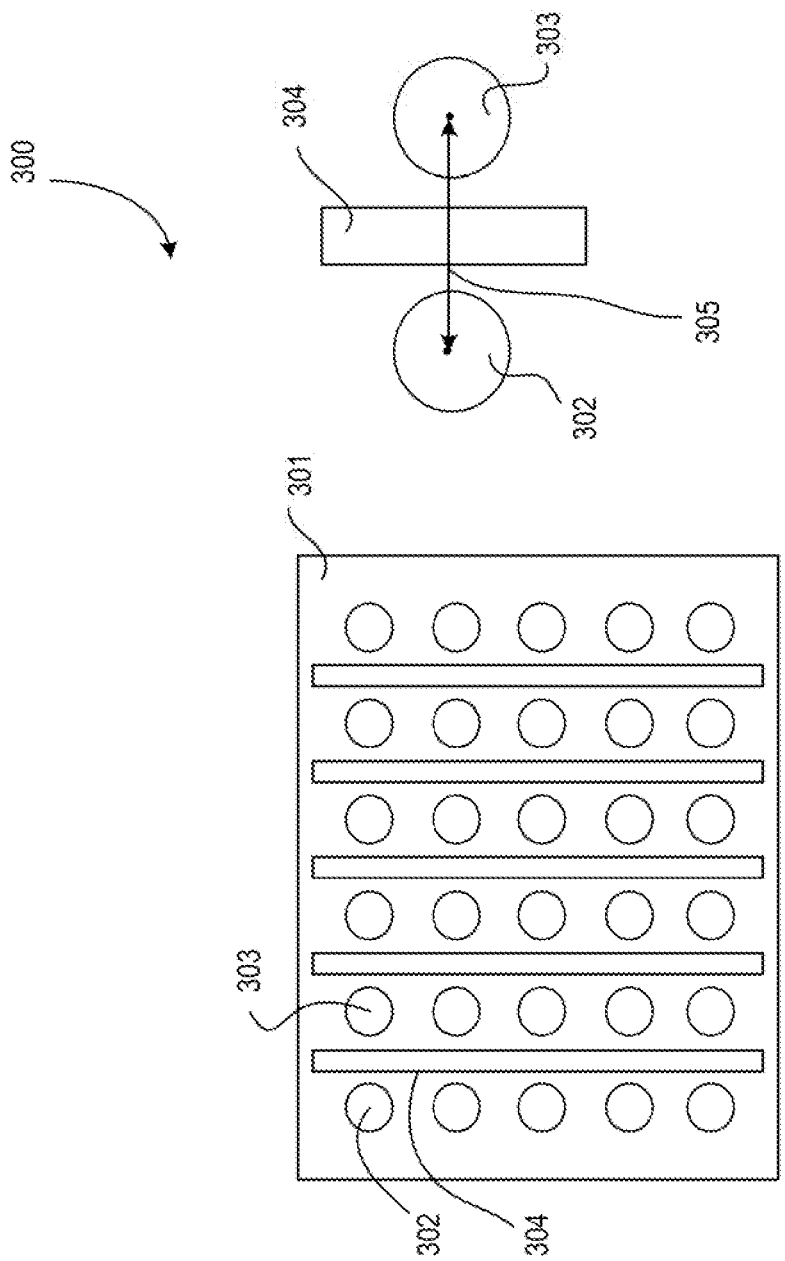
FIG. 3 illustrates a top view of a substrate having circle landing pads.

FIG. 3 illustrates top view 300 of substrate 301 having circle landing pads 302. Here, the distance between the centers of the circle landing pads (e.g., landing pads 302 and 303) is 305. This distance is typically short enough to barely allow one interconnect routing 305. To allow for more escape routings (e.g., more interconnects such as interconnect 304 to pass through between two TSV landing pads), the distance between the TSV routing pads 302 and 303 is increased. Such increase in distance causes the form factor of the 3D IC stack to widen, which is generally not desired because it leads to larger package size and cost.

Figure 4:
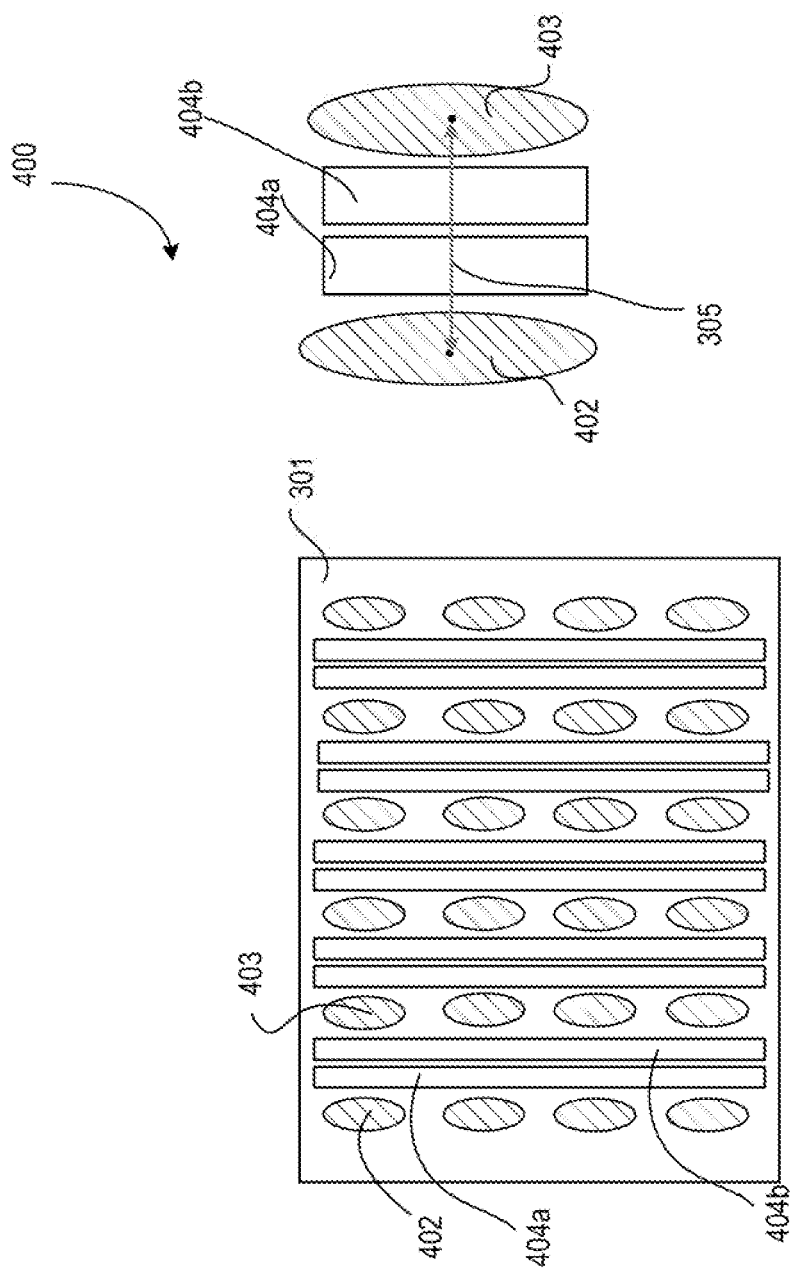
FIG. 4 illustrates a top view of a substrate having non-circle landing pads resulting in increased routing density, according to some embodiments of the disclosure.

FIG. 4 illustrates top view 400 of substrate 301 having non-circle landing pads (e.g., 402 and 403) that result in increased routing density, according to some embodiments of the disclosure. In some embodiments, by changing the shape of the TSV landing pad from a circle shape to a non-circle shape, more space is realized between the centers of the non-circle landing pads (e.g., 402 and 403). For example, while the distance 305 between the landing pads remains the same between FIG. 3 and FIG. 4, more than one interconnect can be routed between the non-circle landing pads. In this example, two interconnects 404a and 404b can be routed between the landing pads by changing the shape of the landing pads from circle to non-circle. This allows to further shrink the form factor of the 3D IC stack, which may be desirable for realizing ever shrinking hand-held and wearable devices.

In some embodiments, by optimizing the shapes of landing pads along the direction of routing, bump-to-bump spacing can be increased which results in more traces being fitted between bumps. This allows for higher input-output (I/O) routing density thus reducing layer count for substrates, for example. A person skilled in the art would appreciate that by reducing layer count of a substrate, the height (e.g., in the z-direction) of the package reduces which further reduces the manufacturing cost of the 3D IC stack or the 2D IC stack.

Figure 5:
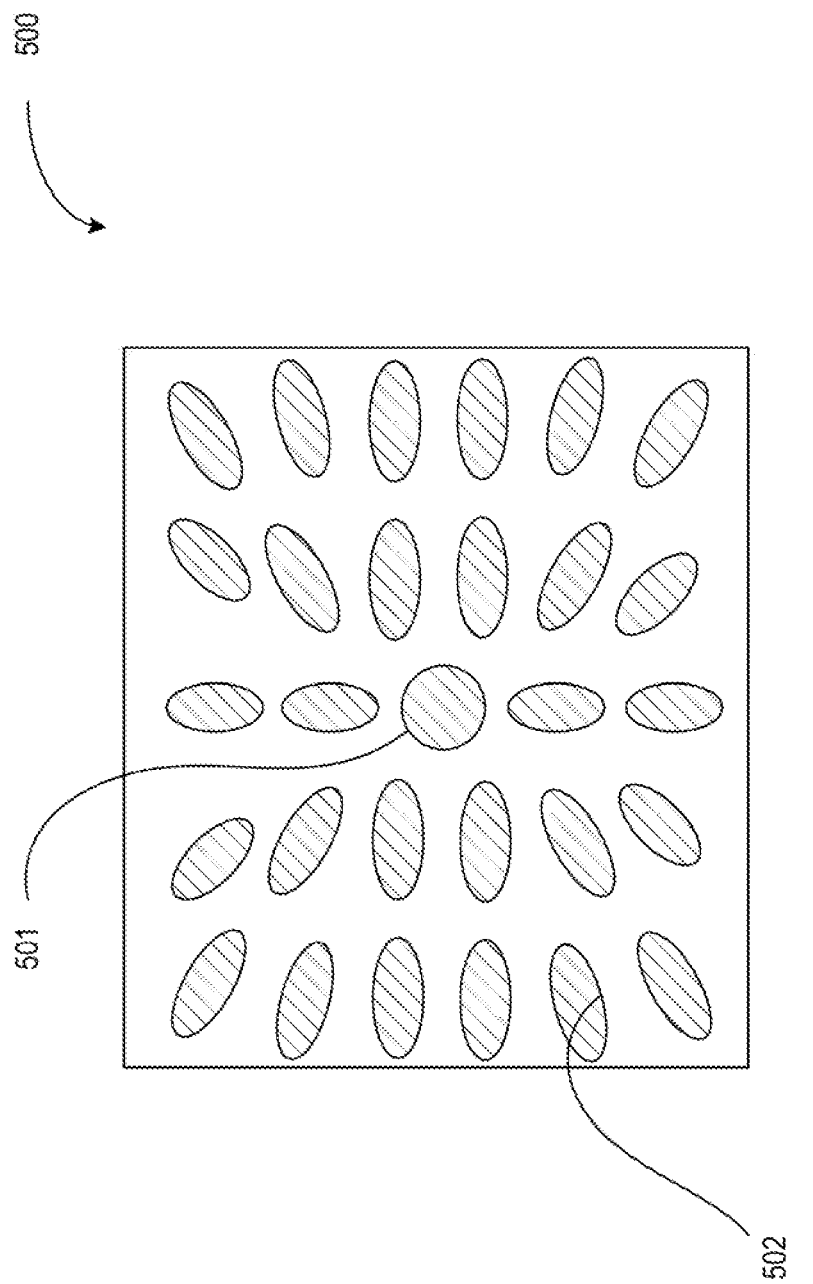
FIG. 5 illustrates a top view of a substrate having non-circle landing pads with different sizes and positioned around a circle landing pad, according to some embodiments of the disclosure.

FIG. 5 illustrates top view 500 of a substrate having non-circle landing pads 502 with different sizes around a circle landing pad 501, according to some embodiments of the disclosure. In some embodiments, by mixing sizes and shapes of ILI bumps (or TSV landing pads) allows the design flexibility to ensure TSV etch uniformity and near-uniform copper density. In some embodiments, non-circle TSV landing pads 502 can be arranged around a circle landing pad 501 to increase routing density, improve TSV etch uniformity, and to realize near-uniform copper density. While the embodiment of FIG. 5 shows all non-circle landing pads as oval, they can be of any non-circle shape that provides the escape routing enhancement and TSV etch uniformity. For example, various non-circle TSVs 502 can be rectangle, L-shaped, S-shaped, U-shaped, elliptical shape, a shape achieved by merging of two circles, etc. instead of oval shape for the landing pad to couple with a plurality of TSVs.

Figure 6:
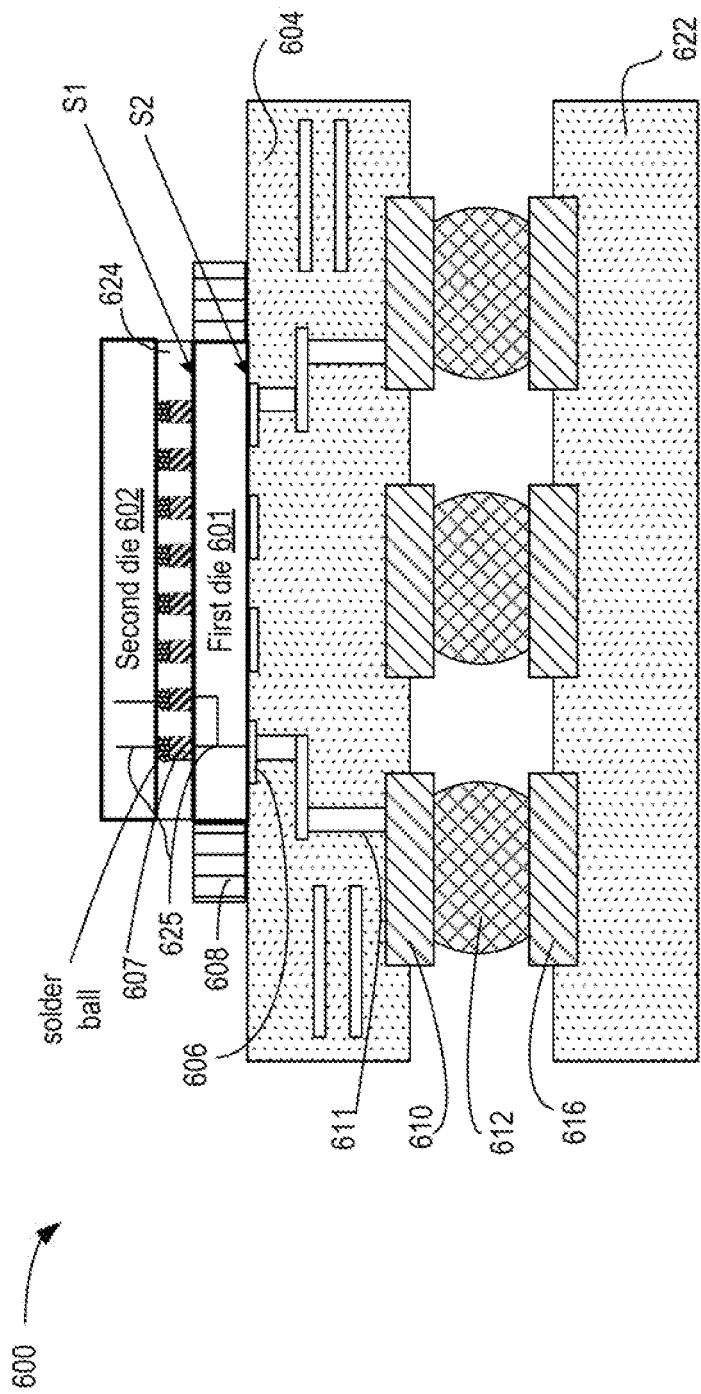
FIG. 6 illustrates cross-sections of multiple dies coupled via through-silicon-vias (TSVs) that land on non-circle landing pads, according to some embodiments of the disclosure.

FIG. 6 illustrates cross-sections 600 of multiple dies coupled via TSVs that land on non-circle landing pads, according to some embodiments of the disclosure. It is pointed out that those elements of FIG. 6 having the same reference numbers (or names) as the elements of any other figure can operate or function in any manner similar to that described, but are not limited to such.

In some embodiments, cross-sectional view 600 is of an IC package assembly, in accordance with various embodiments. In some embodiments, IC package assembly may include First die 601, package substrate 604 (or interposer), and circuit board 622 (which may be a substrate). IC package assembly of cross-sectional view 600 is one example of a stacked die configuration in which First die 601 is coupled to package substrate 604, and Second die 602 is coupled with First die 601, in accordance with some embodiments.

In some embodiments, First die 601 may have a first side S1 and a second side S2 opposite to the first side S1. TSVs may also exist in First and Second dies (601 and 602, respectively) as illustrated by vias 625, in accordance with some embodiments. In some embodiments, first side S1 may be the side of the die commonly referred to as the "inactive" or "back" side of the die. In some embodiments, second side S2 may include one or more transistors, and may be the side of the die commonly referred to as the "active" or "front"

side of the die. In some embodiments, second side S2 of First die 601 may include one or more electrical routing features 606. In some embodiments, Second die 602 may include an "active" or "front" side with one or more electrical routing features 606. In some embodiments, electrical routing features 606 may be bond pads e.g., formed from a combination of metal bumps and solder balls).

In some embodiments, Second die 602 may be coupled to First die 601 in a front-to-back configuration (e.g., the "front" or "active" side of Second die 602 is coupled to the "back" or "inactive" side S1 of First die 601) via interconnect 607 (e vias, bumps, solder balls, etc.). In some embodiments, dies may be coupled with one another in a front-to-front, back-to-back, or side-to-side arrangement. In some embodiments, one or more additional dies may be coupled with First die 601, Second die 602, and/or with package substrate interposer 604. Other embodiments may lack Second die 602. In some embodiments, First die 601 may include one or more TSVs.

In some embodiments, Second die 602 is coupled to First die 601 by die interconnects formed from a combination of bumps and solder balls. In some embodiments, inter-die interconnects may be solder bumps, copper pillars, or other electrically conductive features. In some embodiments, copper pillars 607 are formed to attach to the solder balls and thus couple First die 601 with Second die 602. In some embodiments, an interface layer 624 may be provided between First die 601 and Second die 602. In some embodiments, interface layer 624 is a solder based interconnect layer. For example, bumps coupled to First die 601 couple to solder balls which couple to bumps coupled to Second die 602. In some embodiments, interface layer 624 may be, or may include, a layer of under-fill, adhesive, dielectric, or other material. In some embodiments, interface layer 624 may serve various functions, such as providing mechanical strength, conductivity, heat dissipation, or adhesion.

In some embodiments, First die 601 and Second die 602 may be single dies. In other embodiments, First die 601 and/or Second die 602 may include two or more dies. For example, in some embodiments, First die 601 and/or Second die 602 may be a wafer (or portion of a wafer) having two or more dies formed on it. In some embodiments, First die 601 and/or Second die 602 includes two or more dies embedded in an encapsulant. In some embodiments, the two or more dies are arranged side-by-side, vertically stacked, or positioned in any other suitable arrangement. In some embodiments, the IC package assembly may include, for example, combinations of flip-chip and wire-bonding techniques, interposers, multi-chip package configurations including system-on-chip (SoC) and/or package-on-package (PoP) configurations to route electrical signals.

In some embodiments, First die 601 and/or Second die 602 may be a primary logic die. In some embodiments, First die 601 and/or Second die 602 may be configured to function as memory, an application specific circuit (ASIC), a processor, an RF IC, a baseband processor, or some combination of such functions. For example, First die 601 may include a processor and Second die 602 may include memory. In some embodiments, one or both of First die 601 and Second die 602 may be embedded in encapsulant 608. In some embodiments, encapsulant 608 can be any suitable material, such as epoxy-based build-up substrate, other dielectric/organic materials, resins, epoxies, polymer adhesives, silicones, acrylics, polyimides, cyanate esters, thermoplastics, and/or thermosets.

In some embodiments, First die 601 may be coupled to package substrate interposer 604 (e.g., region 108). In some embodiments, package substrate interposer 604 may be a coreless substrate interposer. For example, package substrate interposer 604 may be a bumpless build-up layer (BBUL) assembly that includes a plurality of "bumpless" build-up layers. Here, the term "bumpless build-up layers" generally refers to layers of substrate and components embedded therein without the use of solder or other attaching means that may be considered "bumps." However, the various embodiments are not limited to BBUL type connections between die and substrate interposer, but can be used for any suitable flip chip substrates.

In some embodiments, the one or more build-up layers may have material properties that may be altered and/or optimized for reliability, warpage reduction, etc. In some embodiments, package substrate interposer 604 may be composed of a polymer, ceramic, glass, or semiconductor material.

In some embodiments, layer 622 may be a Printed Circuit Board (PCB) composed of an electrically insulative material such as an epoxy laminate. For example, layer 622 (e.g., region 115) may include electrically insulating layers composed of materials such as, phenolic cotton paper materials (e.g., FR-1), cotton paper and epoxy materials (e.g., FR-3), woven glass materials that are laminated together using an epoxy resin (FR-4), glass/paper with epoxy resin (e.g., CEM-1), glass composite with epoxy resin, woven glass cloth with polytetrafluoroethylene PTFE CCL), or other polytetrafluoroethylene-based prepreg material.

Structures such as traces, trenches, and vias (which are not shown here) may be formed through the electrically insulating layers to route the electrical signals of First die 601 through the layer 622. Layer 622 may be composed of other suitable materials in other embodiments. In some embodiments, layer 622 may include other electrical devices coupled to the circuit board that are configured to route electrical signals to or from First die 601 through layer 622. In some embodiments, layer 622 may be a motherboard.

In some embodiments, a first side of package substrate interposer 604 is coupled to second surface S2 and/or electrical routing features 606 of First die 601. In some embodiments, a second opposite side of package substrate interposer 604 is coupled to layer 622 by package interconnects 612. In some embodiments, package interconnects 612 may couple electrical routing features 610 (e.g., non-circle TSV landing pads) disposed on the second side of package substrate interposer 604 to corresponding electrical routing features 616 on layer 622. In some embodiments, non-circle TSV landing pads 610 are for landing one or more TSVs 611 and coupling them to solder bumps 612.

In some embodiments, package substrate interposer 604 may have electrical routing features formed therein to route electrical signals between First die 601 (and/or the Second die 602) and layer 622 and/or other electrical components external to the IC package assembly. In some embodiments, package interconnects 612 and die interconnects 606 include any of a wide variety of suitable structures and/or materials including, for example, bumps, pillars or balls formed using metals, alloys, solderable material, or their combinations. In some embodiments, electrical routing features 610 may be arranged in a ball grid array ("BGA") or other configuration.

Figures 7A, 7B:
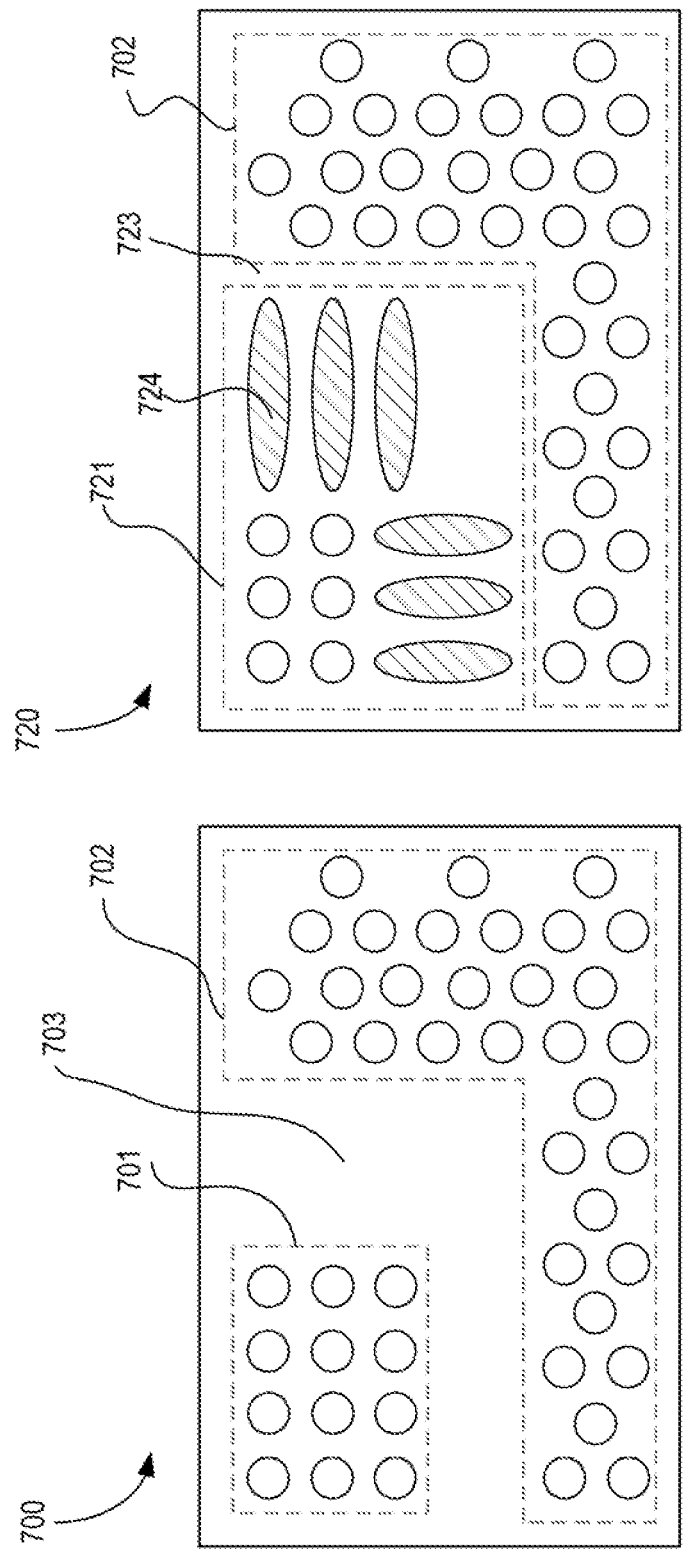
FIG. 7A illustrates a top view of a substrate with two types of patterns for landing pads and a wide transition zone between the two types of landing pads.
FIG. 7B illustrates a top view of a substrate with two types of patterns for landing pads and a narrow transition zone between the two types of landing pads, according to some embodiments of the disclosure.

FIG. 7A illustrate top view 700 of a substrate with two types of patterns for landing pads and a wide transition zone between the two type of landing pads. Here, the two types of patterns are pattern 701 and pattern 702, where both patterns have circle TSV landing pads but in different arrangement. The region separating the two pattern of TSVs is referred to as the transition region or zone 703. These transition regions 703 may be a waste of space and are a by-product of fabricating technologies. Larger transition zones may cause epoxy voids between joints.

FIG. 7B illustrate top view 720 of a substrate with two types of patterns for landing pads and a narrow transition zone between the two types of landing pads, according some embodiments of the disclosure. The flexibility to vary the number, shape, and placement of landing pad and/or substrate bumps allows a designer to reduce impact of transitions in ILI patterns on assembly. Here, the two types of patterns are pattern 721 and pattern 702, where both patterns have TSV landing pads but in different arrangement. In some embodiments, the TSV landing pads along the boundary of the transition zone 703 (which later becomes 723) are non-circle landing pads 724. These non-circle landing pads 724 use up most of the white space of the transition zone resulting in a narrow transition zone 723. As such, the probability of having voids in the epoxies is reduced because of narrower transition zones 723. While the embodiment of FIG. 7B shows all non-circle landing pads 724 as oval, they can be of any non-circle shape that provides the escape routing enhancement and TSV etch uniformity. For example, various non-circle TSV landing pads 724 can be rectangle, L-shaped, S-shaped, U-shaped, elliptical shaped, a shape achieved by merging of two circles, etc. instead of oval shape for the edge landing pads 724. While the embodiment of FIG. 7B shows non-circle TSV landing pads on the edges of pattern of TSVs 721, non-circle TSV landing pads 724 can also be used for landing pads along the edge of transition zone 723 associated with the second pattern of TSV landing pads 702.

FIG. 8A illustrates top view 800 of a circle landing pad with three TSVs for power/ground routing. In some cases, power or ground routings are desired to be routed through a single landing pad. However, a circle landing pad may allow for a smaller number of power or ground routings. One such example is illustrated in FIG. 8A where TSV landing pad 801 can allow only three power or ground TSVs 802. When large amount of current flows through these TSVs, they may cause electro-migration.

FIG. 8B illustrates top view 820 of a non-circle landing pad 821 with more than three TSVs 822 for power/ground routing, according to some embodiments of the disclosure. Compared to FIG. 8A, here a larger group of TSVs can land on the same landing pad thereby providing the opportunity to supply more power or ground return path. Having multiple TSVs for providing power reduces the probability of electro migration. While the embodiment of FIG. 8B shows non-circle landing pad 821 as oval, it can be of any non-circle shape that provides more power and/or ground routing capability. For example, the non-circle TSV landing pad 821 can be rectangle, L-shaped, S-shaped, U-shaped, elliptical shaped, a shape achieved by merging of two circles, etc. instead of an oval shape.

FIG. 9A illustrates cross-section 900 of a substrate with some TSVs having a gap between landing pads causing electrical open circuits. As mentioned in the background section, the TSV etch rate plays a role in realizing good connections of TSVs to their respective landing pads. The etch rate of TSVs depends on the local density of the TSVs. For example, when TSV density goes up, TSV etch rate goes down leading to electrical opens.

In this example, with reference to etching of TSVs, TSVs 901 are slower TSVs than TSV 902 in that TSVs 901 are yet to land on their pad 904 while TSVs 902 have already landed on their landing pad. As a result, the slower TSVs may not connect with their landing pad causing a gap 903 between the TSV 901 and the landing pad 904. A top view of cross-section AA shows that the gaps 903 result in no connection (e.g., opens) between TSVs 901 and their respective landing pads 904 while TSVs 902 properly connect with their landing pads.

FIG. 9B illustrates cross-section 920 of a substrate with some undercut TSVs resulting in electrical shorts in the landing pads. It is pointed out that those elements of FIG. 9B having the same reference numbers (or names) as the elements of any other figure can operate or function in any manner similar to that described, but are not limited to such. In some cases, to mitigate the problem of opens discussed with reference to FIG. 9A, over-etching is used to properly land TSVs 901 (which now become 921) to their respective landing pads 904. However, over-etching may lead to undercuts 923 in faster TSVs (e.g., those TSVs that would otherwise land on their respective landing pads before TSVs 901 land). The top view along the dotted line AA shows the problem of undercutting. In this example, TSVs 921 land on their respective landing pads 904, but TSVs 922 short with one another within the landing pad.

FIG. 10 illustrates cross-section 1000 of a substrate with non-circle landing pad(s) and dummy TSVs for mitigating the issues of opens and shorts illustrated in FIGS. 9A-B, according to some embodiments of the disclosure. It is pointed out that those elements of FIG. 10 having the same reference numbers (or names) as the elements of any other figure can operate or function in any manner similar to that described, but are not limited to such. In some embodiments, TSV landing pad 1005 is made non-circle and additional, extra, or dummy TSV(s) 1003 are provided adjacent to TSVs 1001 and/or 1002 to increase density of the TSVs. For example, regions where there are fewer TSVs, additional dummy TSVs may be formed adjacent to them to increase the overall density of the TSVs in that region.

As the TSV density increases, problems related to undercuts are mitigated. When dummy TSVs are added, non-circle TSV landing pads are used to accommodate the dummy TSVs. In this example, the four TSVs 1001 meet the density requirement and therefore may couple to their TSV landing pads 1004 properly. Conversely, absent TSV 1003, the two TSVs 1002 may not meet the density requirement for TSVs. As a result, undercut issues would be seen, absent dummy TSV 1003. In some embodiments, when TSV 1003 is added to the low density TSV region, the problem with undercut is resolved. To accommodate the extra TSVs, a non-circle TSV landing pad 1005 is used. Top view of dotted region AA shows all TSVs landing on their respective landing pads because of non-circle TSV landing pad 1005 and extra TSVs 1003.

Figure 11:
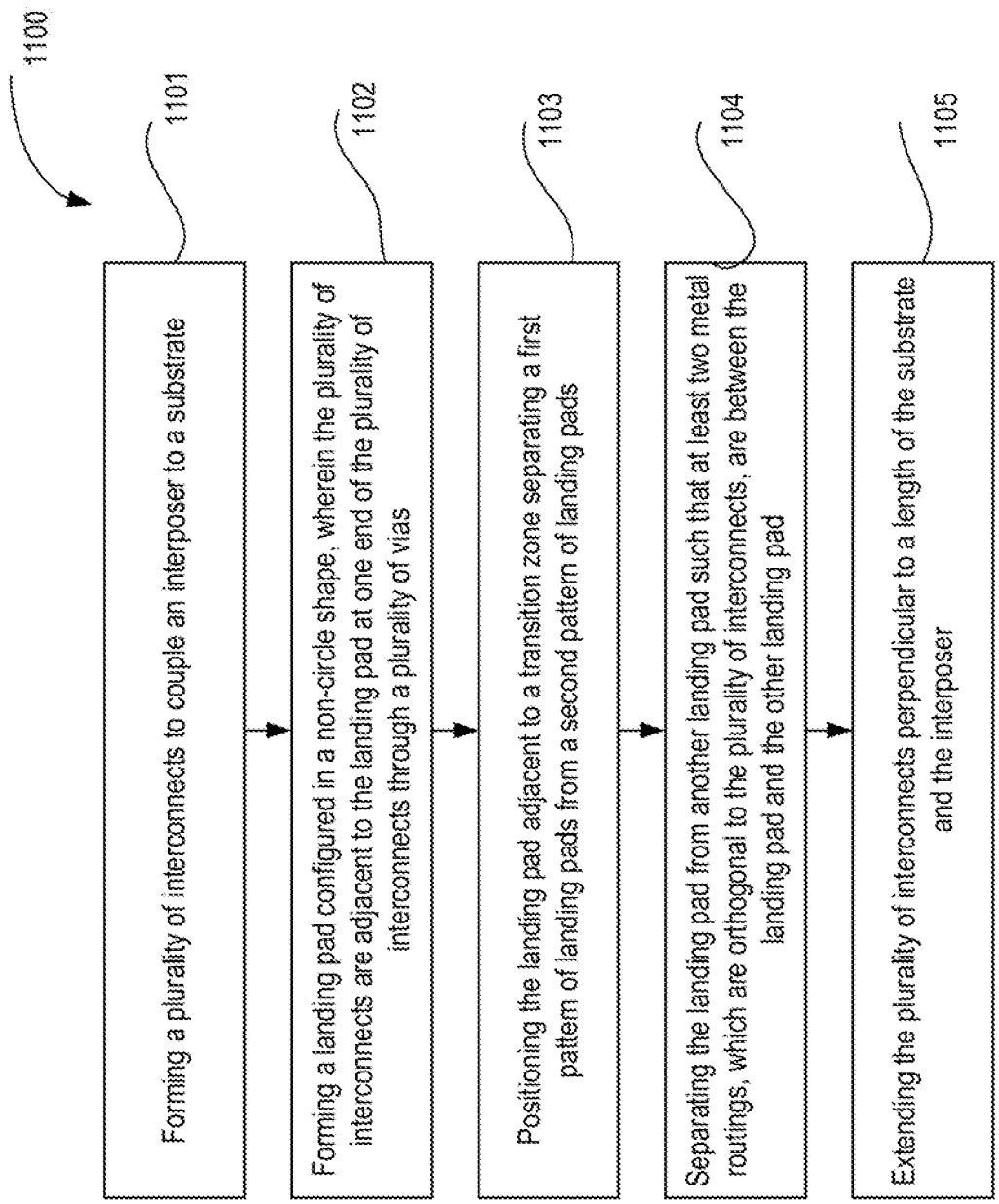
FIG. 11 illustrates a flowchart of part of a method for forming a 3D IC stack using non-circle TSVs, according to some embodiments of the disclosure.

FIG. 11 illustrates flowchart 1100 of part of a method for forming a 3D IC stack using non-circle TSVs, according to some embodiments of the disclosure. It is pointed out that those elements of FIG. 11 having the same reference numbers (or names) as the elements of any other figure can operate or function in any manner similar to that described, but are not limited to such.

Although the blocks in the flowchart with reference to FIG. 11 are shown in a particular order, the order of the actions can be modified. Thus, the illustrated embodiments can be performed in a different order, and some actions/blocks may be performed in parallel. Some of the blocks and/or operations listed in FIG. 11 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 1101, a plurality of interconnects (e.g., 210*a-e* and 611) are formed to couple an interposer (e.g., 108 and 604) to a substrate (e.g., 115, 301, and 622). In some embodiments, the plurality of interconnects are to provide a power supply or a ground supply, or wherein at least one of the plurality of interconnects is a dummy interconnect (e.g., 1003). At block 1102, a landing pad (e.g., 213, 402, 403, 502, 610, 724, 821, 1005) is formed which is configured in a non-circle shape, wherein the plurality of interconnects are adjacent to the landing pad at one end of the plurality of interconnects (e.g., ILIs and TSVs) through a plurality of vias (not shown). These plurality of vias are generally positioned between TSVs and TSV landing pads. At block 1103, the landing pad (e.g., 724) is positioned adjacent to a transition zone (e.g., 723) separating a first pattern (e.g., 721) of landing pads from a second pattern (e.g., 702) of landing pads. At block 1104, the landing pad (e.g., 402) is separated from another landing pad (e.g., 403) such that at least two metal routings (e.g., 404*a* and 404*b*), which are orthogonal to the plurality of interconnects, are between the landing pad and the other landing pad. At block 1105, the plurality of interconnects are extended perpendicular to a length of the substrate and the interposer, wherein the landing pad comprises a material selected from a group consisting of: Cu, Al, and Ni.

Figure 12:
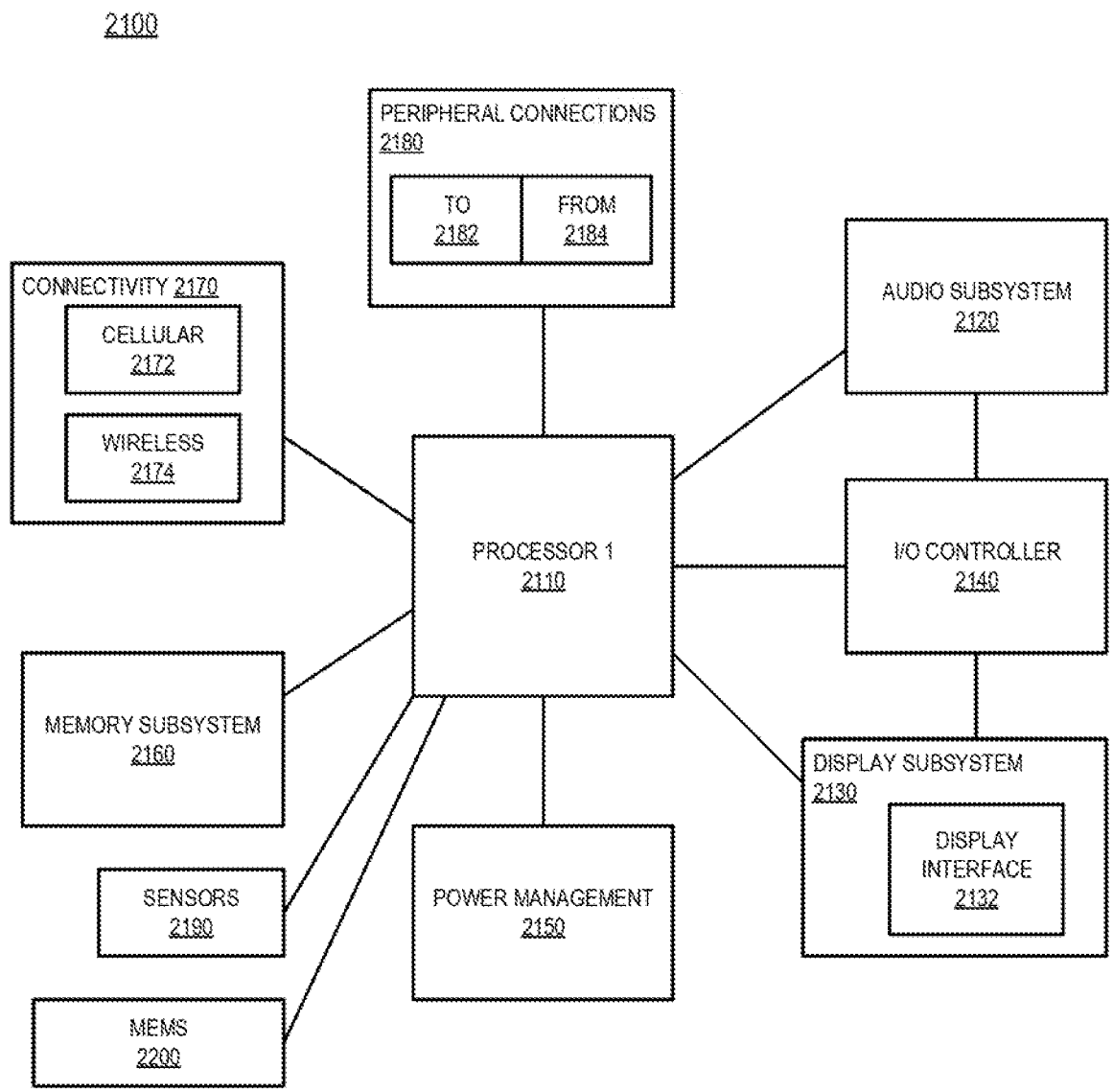
FIG. 12 illustrates a smart device or a computer system or a SoC (System-on-Chip) having TSVs attached to non-circle landing pads, according to some embodiments.

FIG. 12 illustrates a smart device or a computer system or a SoC (System-on-Chip) having TSVs attached to non-circle landing pads, according to some embodiments. It is pointed out that those elements of FIG. 12 having the same reference numbers (or names) as the elements of any other figure can operate or function in any manner similar to that described, but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure.

FIG. 12 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100. Here, the various blocks forming the SOC may be packaged as a 3D IC where various dies communicate with other dies through TSVs, and where the TSVs are coupled to non-circle landing pads according to various embodiments. The non-circle TSVs allow for higher density of escape routing which is beneficial to integrating the various blocks of the SOC.

In some embodiments, computing device 2100 includes a first processor 2110 (e.g., First die 601). The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or another processor, e.g., Second die 602) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions. The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2190 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In some embodiments, SOC 2100 includes Sensors 2190 (e.g., temperature sensors, accelerometers, gyroscopes, etc.). In some embodiments, SOC 2100 includes one or more MEMs 2200 (Microelectromechanical systems).

In addition to a proprietary docking connector or other proprietary connection hardware, the computing device 2100 can make peripheral connections 2680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 describes an apparatus which comprises: a plurality of interconnects to couple a silicon interposer to a substrate; and a landing pad configured in a non-circle shape, wherein the plurality of interconnects are adjacent to the landing pad at one end of the plurality of interconnects through a plurality of vias, according to some embodiments of the disclosure.

Example 2 includes features of example 1 wherein the landing pad is positioned adjacent to a transition zone separating a first pattern of landing pads from a second pattern of landing pads, according to some embodiments of the disclosure, according to some embodiments of the disclosure.

Example 3 includes features of example 1 wherein the landing pad is separated from another landing pad such that at least two metal routings, which are orthogonal to the plurality of interconnects, are between the landing pad and the other landing pad, according to some embodiments of the disclosure.

Example, 4 includes features according to any one of examples 1 to 3 wherein the plurality of interconnects are to provide a power supply or a ground supply, according to some embodiments of the disclosure.

Example 5 includes features of example 1 wherein at least one of the plurality of interconnects is a dummy interconnect, according to some embodiments of the disclosure.

Example 6 includes features of example 1 wherein the plurality of interconnects extend perpendicular to a length of the substrate and the silicon interposer, according to some embodiments of the disclosure.

Example 7 includes features of example 1 wherein the landing pad comprises a material selected from a group consisting of: Cu, Al, and Ni, according to some embodiments of the disclosure.

Example 8 includes features of example 1 wherein the landing pad has a shape which is one of: an oval shape, an L-shape, a U-shape, elliptical shape, a combination of two circles, or a rectangular shape, according to some embodiments of the disclosure.

Example 9 includes features of example 1 and comprises a first processor die coupled to the silicon interposer via solder balls, according to some embodiments of the disclosure.

Example 10 includes features of example 9 and comprises a second processor die coupled to the silicon interposer via solder balls, according to some embodiments of the disclosure.

Example 11 provides another apparatus which comprises: a plurality of through-silicon-vias (TSVs); and a landing bump configured in a non-circle shape, wherein the plurality of TSVs are coupled to the landing bump at one end of the plurality of TSVs, according to some embodiments of the disclosure.

Example 12 includes features of example 11 wherein the landing bump is positioned adjacent to a transition zone separating a first pattern of landing bumps from a second pattern of landing bumps, wherein the landing bump is associated with the first pattern of landing bumps, according to some embodiments of the disclosure.

Example 13 includes features of example 11 wherein the landing bump is separated from another landing bump such that at least two metal routings, which are orthogonal to the plurality of TSVs, are between the landing bump and the other landing bump, according to some embodiments of the disclosure.

Example 14 includes features of any one of examples 11 to 13 wherein the plurality of TSVs are to provide a power supply or a ground supply, according to some embodiments of the disclosure.

Example 15 includes features of example 11 wherein at least one of the plurality of TSVs is a dummy TSV, according to some embodiments of the disclosure.

Example 16 includes features of example 11 wherein the plurality of TSVs extend perpendicular to a length of the substrate and the interposer, according to some embodiments of the disclosure.

Example 17 includes features of example 11 wherein the landing bump comprises a material selected from a group consisting of: Cu, Al, and Ni, according to some embodiments of the disclosure.

Example 18 includes features of example 11 wherein the landing bump has a shape which is one of: an oval shape, an L-shape, U-shape, elliptical shape, a combination of two circles, or a rectangular shape, according to some embodiments of the disclosure.

Example 19 provides a method which comprises: forming a plurality of interconnects to couple a silicon interposer to a substrate; and forming a landing pad configured in a non-circle shape, wherein the plurality of interconnects are adjacent to the landing pad at one end of the plurality of interconnects through a plurality of vias, according to some embodiments of the disclosure.

Example 20 includes features of example 19 and comprises positioning the landing pad adjacent to a transition zone separating a first pattern of landing pads from a second pattern of landing pads; and separating the landing pad from another landing pad such that at least two metal routings, which are orthogonal to the plurality of interconnects, are between the landing pad and the other landing pad, according to some embodiments of the disclosure.

Example 21 includes features of example 20 wherein the plurality of interconnects are to provide a power supply or a ground supply, or wherein at least one of the plurality of interconnects is a dummy interconnect, according to some embodiments of the disclosure.

Example 22 includes features of any one of examples 20 to 22 and comprises extending the plurality of interconnects perpendicular to a length of the substrate and the silicon interposer, wherein the landing pad comprises a material selected from a group consisting of: Cu, Al, and Ni, according to some embodiments of the disclosure.

Example 23 describes a system which comprises: a substrate having substrate bumps; a silicon interposer coupled to the substrate bumps and landing bumps, wherein the silicon interposer comprises a plurality of through-silicon-vias (TSVs), wherein at least one landing bump of the landing bumps is configured in a non-circle shape, and wherein at least some of the plurality of TSVs are coupled to the at least one landing bump at one end of the at least some of the plurality of TSVs; a first processor die coupled to the silicon interposer via solder balls; and a second processor die coupled to the silicon interposer via solder balls, according to some embodiments of the disclosure.

Example 24 includes features of example 23 wherein the at least one landing bump is separated from another landing bump such that at least two metal routings, which are orthogonal to the plurality of TSVs, are between the at least one landing bump and the other landing bump, according to some embodiments of the disclosure.

Example 25 includes features according to any one of examples 23 to 25 which includes a wireless interface to allow the first processor die to communicate with another processor die, according to some embodiments of the disclosure.

Example 26 describes an apparatus which comprises: means for coupling a silicon interposer to a substrate; and landing means configured in a non-circle shape, wherein the means for coupling are adjacent to the landing means at one end of the means for coupling through a plurality of vias, according to some embodiments of the disclosure.

Example 27 includes features of example 26 wherein the landing means are positioned adjacent to a transition zone separating a first pattern of landing means from a second pattern of landing means, according to some embodiments of the disclosure.

Example 28 includes features of example 26 wherein the landing means are separated one another landing means such that at least two metal routings, which are orthogonal to the coupling means, are between the landing means and the other landing means, according to some embodiments of the disclosure.

Example 29 includes features of example 27 wherein the coupling means are to provide a power supply or a ground supply, or wherein at least one of the coupling means is a dummy coupling mean, according to some embodiments of the disclosure.

Example 30 includes features of any one of examples 26 to 29 wherein the coupling means are extended perpendicular to a length of the substrate and the silicon interposer, wherein the landing means comprises a material selected from a group consisting of: Cu, Al, and Ni, according to some embodiments of the disclosure.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

I claim:

1. An apparatus, comprising:
a plurality of through-silicon-vias (TSVs) within an interposer, the plurality of TSVs comprising one or more functional TSVs and one or more dummy TSVs; and
a landing pad having a non-circle shape along a surface of the interposer, wherein each of the plurality of TSVs, including the one or more functional TSVs and the one or more dummy TSVs, is in direct contact with the landing pad at one end of the plurality of TSVs.

2. The apparatus of claim 1, wherein the landing pad is positioned adjacent to a transition zone separating a first pattern of landing pads from a second pattern of landing pads, wherein the landing pad is associated with the first pattern of landing pads.

3. The apparatus of claim 1, wherein the landing pad is separated from a second landing pad such that at least two metal routings, which are orthogonal to the plurality of TSVs, are between the landing pad and the second landing pad.

4. The apparatus of claim 1, wherein the functional TSVs are to provide a power supply or a ground supply.

5. The apparatus of claim 1, further comprising:
a second TSV within the interposer; and
a second landing pad having a circle shape along the surface of the interposer, wherein the second landing pad is in direct contact with only the second TSV.

6. The apparatus of claim 1, wherein the plurality of TSVs extend perpendicular to the surface of the interposer.

7. The apparatus of claim 1, wherein the landing pad comprises one or more of Cu, Al, or Ni.

8. The apparatus of claim 1, wherein the landing pad has a shape which is one of an oval shape, an L-shape, a U-shape, an elliptical shape, a shape comprising a combination of two circles, or a rectangular shape.

9. A system comprising:
a substrate comprising substrate bumps;
a silicon interposer coupled to the substrate bumps by landing pads, wherein the silicon interposer comprises a plurality of through-silicon-vias (TSVs), wherein at least one landing pad of the landing pads has a non-circle shape along a surface of the interposer, wherein a plurality of first TSVs of the plurality of TSVs comprise one or more functional TSVs and one or more dummy TSVs, wherein the plurality of first TSVs, including the one or more functional TSVs and the one or more dummy TSVs, are coupled to the at least one landing pad at one end of the plurality of first TSVs;
a first processor die coupled to the silicon interposer via solder balls;
a second processor die coupled to the silicon interposer via solder balls; and
a wireless interface to allow the first processor die to communicate with another processor die.

10. The system of claim 9, wherein the at least one landing pad is separated from a second landing pad such that at least two metal routings, which are orthogonal to the plurality of TSVs, are between the at least one landing pad and the second landing pad.

11. The system of claim 9, further comprising:
a second TSV within the interposer; and
a second landing pad having a circle shape along the surface of the interposer, wherein the second landing pad is in direct contact with only the second TSV.

12. The system of claim 11, wherein the functional TSVs are to provide a power supply or a ground supply.

13. The system of claim 12, wherein the functional TSVs comprise not fewer than four power or ground TSVs.

14. The system of claim 13, wherein the second TSV is to carry a signal.

15. An apparatus, comprising:
a plurality of through-vias within an interposer, the plurality of through-vias comprising one or more functional through-vias and one or more dummy through-vias; and
a landing pad having a non-circle shape along a surface of the interposer, wherein each of the plurality of through-vias, including the one or more functional through-vias and the one or more dummy through-vias, is in direct contact with the landing pad at one end of the plurality of through-vias.

16. The apparatus of claim 15, wherein the landing pad is positioned adjacent to a transition zone separating a first pattern of landing pads from a second pattern of landing pads, wherein the landing pad is associated with the first pattern of landing pads.

17. The apparatus of claim 15, wherein the landing pad is separated from a second landing pad such that at least two metal routings, which are orthogonal to the plurality of through-vias, are between the landing pad and the second landing pad.

18. The apparatus of claim 15, further comprising:
a second through-via within the interposer; and a second landing pad having a circle shape along the surface of the interposer, wherein the second landing pad is in direct contact with only the second through-via.

19. The apparatus of claim 15, wherein the landing pad comprises one or more of Cu, Al, or Ni.

20. The apparatus of claim 15, wherein the landing pad has a shape which is one of an oval shape, an L-shape, a U-shape, an elliptical shape, a shape comprising a combination of two circles, or a rectangular shape.

* * * * *